(12) United States Patent
Conley

(10) Patent No.: US 7,840,875 B2
(45) Date of Patent: Nov. 23, 2010

(54) CONVOLUTIONAL CODING METHODS FOR NONVOLATILE MEMORY

(75) Inventor: Kevin M. Conley, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 778 days.

(21) Appl. No.: 11/383,401

(22) Filed: May 15, 2006

(65) Prior Publication Data

US 2007/0266295 A1    Nov. 15, 2007

(51) Int. Cl.
G11C 29/00 (2006.01)
(52) U.S. Cl. ............................ 714/763; 714/786
(58) Field of Classification Search ............... 714/763, 714/776, 780, 786
See application file for complete search history.

(56) References Cited

U.S. PATENT DOCUMENTS

| 5,022,031 | A |   | 6/1991  | Baggen |
| 5,043,940 | A |   | 8/1991  | Harari ............... 365/185.03 |
| 5,070,032 | A |   | 12/1991 | Yuan et al. ............ 438/267 |
| 5,095,344 | A |   | 3/1992  | Harari ............... 257/328 |
| 5,172,338 | A |   | 12/1992 | Mehrotra et al. ...... 365/185.03 |
| 5,313,421 | A |   | 5/1994  | Guterman et al. ...... 365/185.15 |
| 5,315,541 | A |   | 5/1994  | Harari et al. ......... 365/185.13 |
| 5,343,063 | A |   | 8/1994  | Yuan et al. ........... 257/317 |
| 5,459,742 | A | * | 10/1995 | Cassidy et al. ........ 714/769 |
| 5,532,962 | A |   | 7/1996  | Auclair et al. ........ 365/201 |
| 5,570,315 | A |   | 10/1996 | Tanaka et al. ......... 365/185.22 |
| 5,657,332 | A |   | 8/1997  | Auclair et al. ........ 714/763 |
| 5,661,053 | A |   | 8/1997  | Yuan ................. 438/257 |
| 5,774,397 | A |   | 6/1998  | Endoh et al. ......... 365/185.03 |
| 5,909,449 | A |   | 6/1999  | So et al. ............. 714/721 |
| 5,930,167 | A |   | 7/1999  | Lee et al. ............ 365/185.03 |
| 6,046,935 | A |   | 4/2000  | Takeuchi et al. ...... 365/185.03 |
| 6,212,654 | B1 |   | 4/2001  | Lou et al. |
| 6,222,762 | B1 |   | 4/2001  | Guterman et al. ...... 365/185.03 |
| 6,279,133 | B1 |   | 8/2001  | Vafai et al. |
| 6,397,364 | B1 |   | 5/2002  | Barkan ............... 714/746 |
| 6,456,528 | B1 |   | 9/2002  | Chen ................. 365/185.03 |
| 6,467,062 | B1 |   | 10/2002 | Barkan ............... 714/764 |
| 6,469,931 | B1 |   | 10/2002 | Ban et al. ............ 365/185.08 |
| 6,522,580 | B2 |   | 2/2003  | Chen et al. .......... 365/185.02 |
| 6,674,385 | B2 |   | 1/2004  | Micheloni et al. ..... 341/155 |
| 6,751,766 | B2 |   | 6/2004  | Guterman et al. ...... 714/736 |

(Continued)

FOREIGN PATENT DOCUMENTS

EP    0 380 876 A2    8/1990

(Continued)

OTHER PUBLICATIONS

PCT International Search Report dated Jan. 4, 2008 issued in PCT/US2007/068224 (WO 2007/133963).

(Continued)

*Primary Examiner*—Sam Rizk
(74) *Attorney, Agent, or Firm*—Weaver Austin Villeneuve & Sampson LLP

(57) ABSTRACT

Data are encoded using convolutional coding prior to storage in a nonvolatile memory array, so that errors that occur when the data are read may be corrected even where there is a large number of such errors. Coding rates of less than one increase the amount of data to be stored but allow correction of large numbers of errors.

28 Claims, 5 Drawing Sheets

| Input b | Current $S_1S_2$ | Next $S_1S_2$ | Output $C_0C_1$ |
|---|---|---|---|
| 0 | 0 0 | 0 0 | 0 0 |
| 0 | 0 1 | 0 0 | 1 1 |
| 0 | 1 0 | 0 1 | 0 1 |
| 0 | 1 1 | 0 1 | 1 0 |
| 1 | 0 0 | 1 0 | 1 1 |
| 1 | 0 1 | 1 0 | 0 0 |
| 1 | 1 0 | 1 1 | 1 0 |
| 1 | 1 1 | 1 1 | 0 1 |

U.S. PATENT DOCUMENTS

| | | | |
|---|---|---|---|
| 6,785,164 B2 | 8/2004 | Gonzalez et al. | 365/185.21 |
| 6,873,549 B2 | 3/2005 | Khalid et al. | 365/185.03 |
| 6,894,926 B2 | 5/2005 | Guterman et al. | 365/185.03 |
| 6,925,007 B2 | 8/2005 | Harari et al. | 365/185.15 |
| 6,941,412 B2 | 9/2005 | Gongwer et al. | 711/103 |
| 6,952,365 B2 | 10/2005 | Gonzalez et al. | 365/185.03 |
| 6,977,844 B2 | 12/2005 | Guterman et al. | 365/185.18 |
| 6,983,428 B2 | 1/2006 | Cernea | 716/1 |
| 7,012,835 B2 | 3/2006 | Gonzalez et al. | 365/185.11 |
| 7,035,146 B2 | 4/2006 | Hemink et al. | 365/185.22 |
| 7,088,621 B2 | 8/2006 | Guterman et al. | 365/185.18 |
| 7,092,290 B2 | 8/2006 | Hemink | 365/185.18 |
| 7,388,781 B2 | 6/2008 | Litsyn et al. | |
| 2005/0013171 A1 | 1/2005 | Ban et al. | |
| 2005/0204212 A1 | 9/2005 | Noguchi et al. | 714/710 |
| 2005/0213393 A1 | 9/2005 | Lasser | 365/185.33 |
| 2006/0018171 A1 | 1/2006 | Austin et al. | |
| 2006/0101193 A1 | 5/2006 | Murin | 711/103 |
| 2007/0086239 A1 | 4/2007 | Litsyn et al. | |
| 2007/0089034 A1 | 4/2007 | Litsyn et al. | |
| 2007/0124652 A1 | 5/2007 | Litsyn et al. | |
| 2007/0150790 A1 | 6/2007 | Gross et al. | 714/763 |
| 2007/0150791 A1 | 6/2007 | Gross et al. | 714/763 |
| 2007/0171714 A1* | 7/2007 | Wu et al. | 365/185.09 |
| 2007/0171730 A1* | 7/2007 | Ramamoorthy et al. | 365/185.33 |
| 2007/0266296 A1 | 11/2007 | Conley | |
| 2007/0283227 A1 | 12/2007 | Sharon et al. | |
| 2008/0010581 A1 | 1/2008 | Alrod et al. | |

FOREIGN PATENT DOCUMENTS

| | | | |
|---|---|---|---|
| WO | WO 2007/133963 A2 | 11/2007 | |

OTHER PUBLICATIONS

Written Opinion dated Jan. 4, 2008 issued in PCT/US2007/068224 (WO 2007/133963).

U.S. Appl. No. 11/383,405, filed May 15, 2006, Conley.

U.S. Appl. No. 11/536,286, filed Sep. 28, 2006, Brandman et al.

U.S. Appl. No. 11/536,327, filed Sep. 28, 2006, Brandman et al.

U.S. Appl. No. 11/536,347, filed Sep. 28, 2006, Brandman et al.

U.S. Appl. No. 11/536,372, filed Sep. 28, 2006, Brandman et al.

U.S. Appl. No. 11/556,615, filed Nov. 3, 2006, Brandman et al.

U.S. Appl. No. 11/556,626, filed Nov. 3, 2006, Brandman et al.

U.S. Appl. No. 11/556,632, filed Nov. 3, 2006, Brandman.

U.S. Appl. No. 11/556,636, filed Nov. 3, 2006, Brandman.

"Noisy Channel Coding Theorem", Wikipedia, http://en.wikipedia.org/wiki/Shannon%27s_theorem, downloaded Mar. 23, 2006, 3 pages.

"Convolutional Code", Wikipedia, http://en.wikipedia.org/wiki/Convolutional_code, downloaded Mar. 23, 2006, 2 pages.

"Turbo Code", Wikipedia, http://en.wikipedia.org/wiki/Turbo_code, downloaded Mar. 23, 2006, 4 pages.

Chip Fleming, "A Tutorial on Convolutional Coding with Viterbi Decoding," http://home.netcom.com/~chip.f/viterbi/tutorial.html, dated Jan. 31, 2003, downloaded Mar. 23, 2006, 5 pages.

"Error Correcting Codes", http://www.dcs.ed.ac.uk/home/stg/pub/E/ecc.html, downloaded Mar. 18, 2005, 2 pages.

Bernard Sklar, "Fundamentals of Turbo Codes," Prentice Hall, Mar. 15, 2002, 30 pages.

R.Y.S. Tee et al., "Generalized Low-Density Parity-Check Coding Aided Multilevel Codes," IEEE, 2006, 5 pages.

Office action issued Jan. 22, 2009 in U.S. Appl. No. 11/383,405.

U.S. Appl. No. 60/760,622, filed Jan. 20, 2006.

U.S. Appl. No. 60/761,888, filed Jan. 25, 2006.

U.S. Appl. No. 60/771,621, filed Feb. 8, 2006.

U.S. Final Office action issued Jun. 3, 2009 in U.S. Appl. No. 11/383,405.

U.S. Final Office action issued Dec. 2, 2009 in U.S. Appl. No. 11/383,405.

* cited by examiner

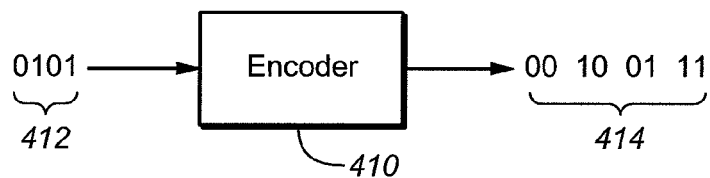
FIG. 4
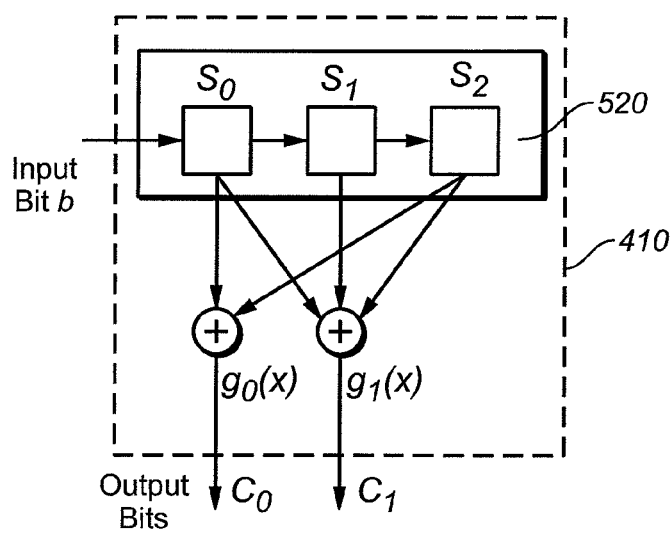
FIG. 5A
| Input<br>b | Current<br>$S_1S_2$ | Next<br>$S_1S_2$ | Output<br>$C_0C_1$ |
|---|---|---|---|
| 0 | 0 0 | 0 0 | 0 0 |
| 0 | 0 1 | 0 0 | 1 1 |
| 0 | 1 0 | 0 1 | 0 1 |
| 0 | 1 1 | 0 1 | 1 0 |
| 1 | 0 0 | 1 0 | 1 1 |
| 1 | 0 1 | 1 0 | 0 0 |
| 1 | 1 0 | 1 1 | 1 0 |
| 1 | 1 1 | 1 1 | 0 1 |
FIG. 5B

CONVOLUTIONAL CODING METHODS FOR NONVOLATILE MEMORY

CROSS REFERENCE TO RELATED APPLICATIONS

This application is related to U.S. patent application Ser. No. 11/383,405 entitled, "Nonvolatile Memory with Convolutional Coding," filed on the same day as the present application; which application is incorporated by reference as if fully set forth herein.

BACKGROUND OF THE INVENTION

The present invention relates generally to nonvolatile memories and to methods of storing data in such memories. In particular the present invention relates to methods of encoding data for storage in nonvolatile memories and to memory systems that use such encoding. All patents, patent applications and other documents cited in the present application are hereby incorporated by reference in their entirety, for all purposes.

There are many commercially successful non-volatile memory products being used today, particularly in the form of small form factor cards, which employ an array of flash EEPROM (Electrically Erasable and Programmable Read Only Memory) cells formed on one or more integrated circuit chips. A memory controller, usually but not necessarily on a separate integrated circuit chip, interfaces with a host to which the card is removably connected and controls operation of the memory array within the card. Such a controller typically includes a microprocessor, some non-volatile read-only-memory (ROM), a volatile random-access-memory (RAM) and one or more special circuits such as one that calculates an error-correction-code (ECC) from data as they pass through the controller during the programming and reading of data. Some of the commercially available cards are CompactFlash™ (CF) cards, MultiMedia cards (MMC), Secure Digital (SD) cards, Smart Media cards, personnel tags (P-Tag) and Memory Stick cards. Other removable flash memory systems include those having USB connections, such as the "Cruzer®" line of products from SanDisk. Hosts include personal computers, notebook computers, personal digital assistants (PDAs), various data communication devices, digital cameras, cellular telephones, portable audio players, automobile sound systems, and similar types of equipment. Besides the memory card implementation, this type of memory system can alternatively be embedded into various types of host systems.

Two general memory cell array architectures have found commercial application, NOR and NAND. In a typical NOR array, memory cells are connected between adjacent bit line source and drain diffusions that extend in a column direction with control gates connected to word lines extending along rows of cells. A memory cell includes at least one storage element positioned over at least a portion of the cell channel region between the source and drain. A programmed level of charge on the storage elements thus controls an operating characteristic of the cells, which can then be read by applying appropriate voltages to the addressed memory cells. Examples of such cells, their uses in memory systems and methods of manufacturing them are given in U.S. Pat. Nos. 5,070,032, 5,095,344, 5,313,421, 5,315,541, 5,343,063, 5,661,053 and 6,222,762.

The NAND array utilizes series strings of more than two memory cells, such as 16 or 32, connected along with one or more select transistors between individual bit lines and a reference potential to form columns of cells. Word lines extend across cells within a large number of these columns. An individual cell within a column is read and verified during programming by causing the remaining cells in the string to be turned on hard so that the current flowing through a string is dependent upon the level of charge stored in the addressed cell. Examples of NAND architecture arrays and their operation as part of a memory system are found in U.S. Pat. Nos. 5,570,315, 5,774,397, 6,046,935, and 6,522,580.

The charge storage elements of current flash EEPROM arrays, as discussed in the foregoing referenced patents, are most commonly electrically conductive floating gates, typically formed from conductively doped polysilicon material. An alternate type of memory cell useful in flash EEPROM systems utilizes a non-conductive dielectric material in place of the conductive floating gate to store charge in a non-volatile manner. A triple layer dielectric formed of silicon oxide, silicon nitride and silicon oxide (ONO) is sandwiched between a conductive control gate and a surface of a semi-conductive substrate above the memory cell channel. The cell is programmed by injecting electrons from the cell channel into the nitride, where they are trapped and stored in a limited region, and erased by injecting hot holes into the nitride. Several specific cell structures and arrays employing dielectric storage elements and are described in U.S. Pat. No. 6,925,007 of Harari et al.

As in most integrated circuit applications, the pressure to shrink the silicon substrate area required to implement some integrated circuit function also exists with flash EEPROM memory cell arrays. It is continually desired to increase the amount of digital data that can be stored in a given area of a silicon substrate, in order to increase the storage capacity of a given size memory card and other types of packages, or to both increase capacity and decrease size. One way to increase the storage density of data is to store more than one bit of data per memory cell and/or per storage unit or element. This is accomplished by dividing a window of a storage element charge level voltage range into more than two states. The use of four such states allows each cell to store two bits of data, eight states stores three bits of data per storage element, and so on. Multiple state flash EEPROM structures using floating gates and their operation are described in U.S. Pat. Nos. 5,043,940 and 5,172,338, and for structures using dielectric floating gates in aforementioned U.S. Pat. No. 6,925,007. Selected portions of a multi-state memory cell array may also be operated in two states (binary) for various reasons, in a manner described in U.S. Pat. Nos. 5,930,167 and 6,456,528.

Memory cells of a typical flash EEPROM array are divided into discrete blocks of cells that are erased together. That is, the block is the erase unit, a minimum number of cells that are simultaneously erasable. Each block typically stores one or more pages of data, the page being the minimum unit of programming and reading, although more than one page may be programmed or read in parallel in different sub-arrays or planes. Each page typically stores one or more sectors of data, the size of the sector being defined by the host system. An example sector includes 512 bytes of user data, following a standard established with magnetic disk drives, plus some number of bytes of overhead information about the user data and/or the block in which they are stored. Such memories are typically configured with 16, 32 or more pages within each block, and each page stores one or just a few host sectors of data.

Individual flash EEPROM cells store an amount of charge in a charge storage element or unit that is representative of one or more bits of data. The charge level of a storage element controls the threshold voltage (commonly referenced as $V_T$)

of its memory cell, which is used as a basis of reading the storage state of the cell. A threshold voltage window is commonly divided into a number of ranges, one for each of the two or more storage states of the memory cell. These ranges are separated by guardbands that include a nominal sensing level that allows determining the storage states of the individual cells. These storage levels may shift as a result of charge disturbing programming, reading or erasing operations performed in neighboring or other related memory cells, pages or blocks. This shift can cause a cell Vt to escape the voltage window into which it was intended during programming. During sensing, this shift may affect the value of the data read. This value appears externally as a change in the data read from the data programmed. Error correcting codes (ECCs) are therefore typically calculated by the controller and stored along with the input data being programmed and used during reading to verify the data and perform some level of data correction if necessary. After such corrections, shifting charge levels can be restored back to the centers of their state ranges from time-to-time, before disturbing operations cause them to shift completely out of their defined ranges and thus cause erroneous data to be read. This process, termed data refresh or scrub, is described in U.S. Pat. Nos. 5,532,962 and 5,909,449.

FIG. 1A shows the threshold voltages ($V_T$) of memory cells A-D in a nonvolatile memory array using binary storage. Two ranges of threshold voltage correspond to two logical states, logic 1 and logic 0. Thus, cells B and D store a logical "1" while cells A and C store a logical "0." However, threshold voltages of individual cells with a particular logical state may differ because of physical differences in the cells, differences in programming, disturbances that affect the programmed threshold voltages, or for other reasons. FIG. 1B shows the distributions of threshold voltages of cells programmed to logic 1 and logic 0 states. The vertical axis of FIG. 1B represents the number of cells (N) at a particular threshold voltage. Each logical state shows a distribution of threshold voltage values about a mean value. No overlap is shown between the distribution for logic 1 and the distribution for logic 0. While some finite probability may exist for a threshold voltage of a cell programmed to a particular logical state to be in the threshold voltage range associated with the other state, for most memories this is an extremely low probability and so relatively weak ECC may be used for binary programming schemes. For example, a single-bit correcting Hamming code has commonly been used in flash memory systems employing binary NAND flash memory.

FIG. 2A shows the threshold voltages of memory cells E-H in another memory system using Multi-Level Cell (MLC) storage. Four ranges of threshold voltage correspond to four logical states in this example. These four logical states represent two bits of data. Thus, cells E and G store a logical "10" cell F stores "00" and cell H stores "01." As with the binary storage example of FIGS. 1A and 1B, threshold voltages of cells in a particular logical state (such as cells E and G) are not all identical. FIG. 2B shows the distributions of threshold voltages for cells in logical states 11, 10, 01, 00.

FIG. 2B shows separation between distributions so that the threshold voltage of a cell clearly indicates one logical state.

FIG. 2C shows another distribution of threshold voltages for cells in logical states 11, 10, 01, 00. Unlike the distributions of FIG. 2B, some overlap occurs between threshold voltage distributions of different logical states. This means that a memory cell that is programmed to a particular logical state may later be read as having a different logical state. For example, a cell programmed with "01" may later be read as "10." This problem generally becomes worse as the number of logical states stored in a cell is increased. One way to deal with this problem is to use Error Correcting Codes (ECC).

FIG. 3 shows a sector of data 300 that is stored in a nonvolatile memory array. Sector 300 includes input data 302 (host data, firmware or system data) and overhead data 304$a$, 304$b$. Overhead data 304$a$, 304$b$ may be in one or more fields that are not necessarily contiguous and are associated with one or more data fields (such as firmware, control data, or other system information). The overhead data typically contain sector mapping information, control flags and ECC data. Here, overhead data 304$a$, 304$b$ include a header 304$a$ and ECC data 304$b$. The ECC data 304$b$ covers the input data 302 itself, and optionally some or all of the overhead data 304$a$, 304$b$. In one example, 512 bytes of input data are provided in a sector with 16 bytes of overhead data. Of the 16 bytes of overhead data, 9 bytes of ECC data are provided in one example. The ECC data are generated from the input data when the input data are stored. Subsequently, when the stored data are read, ECC data are read as part of the operation and are used to identify errors in the input data. If the number of bits in error does not exceed the correction capability of the ECC, ECC can be used to correct the errors. The number of erroneous bits, which represents a difference between the data programmed and the data read, is referred to as the Hamming distance. If the Hamming distance exceeds the correction capability of the ECC but not the detection capability of the ECC, ECC can be used to detect the errors but not to correct them. If the Hamming distance is even larger such that it exceeds the detection capability of the ECC, the use of ECC may incorrectly identify and attempt to correct inappropriate errors in the data errors or may give a false indication that the data is correct. These occurrences are referred to as data miscorrection and data misdetection, respectively. All conventional ECC has such limitations in its ability to detect and correct errors.

SUMMARY OF INVENTION

Data to be stored in a nonvolatile memory array may be encoded prior to storage. Using convolutional coding, a large Hamming distance can be achieved between allowed sequences so that the maximum number of detectable and correctable errors in a portion of data is increased. The increased Hamming distance between allowed sequences reduces the risk of misdetecting or miscorrecting data errors.

In one example a coding rate of ½ is used, so that two encoded bits are produced for every unencoded bit. However, the values of any two encoded bits are derived from more than one unencoded bit. The ½ rate code is used for simplicity of illustration, but it should be understood by those practiced in the art that more efficient code rates can be achieved through the use of other codes. In one example, the values of a pair of output bits depend on the values of three input bits. Such convolutional coding provides a sequence of output bits from any given sequence of input bits. While any sequence of input bits may exist, only certain sequences of output bits may be produced by a particular coding system. The encoded output bits are stored in a nonvolatile memory.

When encoded bits are later read from the nonvolatile memory, they may contain errors. Errors are indicated by any sequence of bits that is not an allowed sequence according to the convolutional coding scheme. Where a sequence is read and is found to include errors, different possible allowed sequences may be compared with the read sequence. The allowed sequence that is closest to the read sequence is chosen as being the correct sequence. From this allowed sequence, the original data is reproduced. Furthermore, maximum likelihood techniques can also iterate the decode process looking for convergence in the likelihood that the decoded sequence was the programmed data.

Convolutional coding may be performed by dedicated circuits either on a memory chip or elsewhere. Convolutional coding may also be performed by firmware on a controller or a combination of firmware and hardware on a controller. In some cases, convolutional coding may be used for some portions of a memory array, while no convolutional coding or different convolutional coding is used for other portions of the memory array. In one example, a memory array stores two bits of data in memory cells of all portions of the memory array. For portions of the memory array that produce high error rates when their data are read, the data are encoded prior to storage. In other examples, a memory array may store more than two bits per cell and rely on convolutional coding to overcome errors caused by overlapping threshold voltage distributions. Different coding rates may be used for different portions of such a memory.

BRIEF DESCRIPTION OF THE DRAWINGS

FIG. 4 shows an encoder according to an embodiment of the present invention.

FIG. 5A shows a more detailed view of the encoder of FIG. 4.

FIG. 5B is a table showing outputs that are produced by different inputs to the encoder of FIG. 5A when the encoder is in different states.

FIG. 6 also shows the states through which the encoder passes and the output bits generated at each stage.

FIG. 7 shows various paths, including discarded paths that are discarded in favor of survivor paths.

DESCRIPTION OF ILLUSTRATED EMBODIMENTS

Figure 1A:
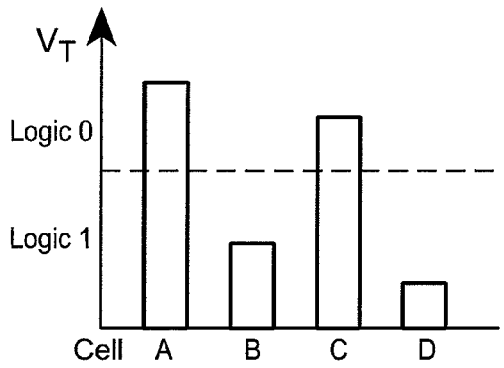
FIG. 1A shows threshold voltages of memory cells A-D, the threshold voltages representing two logical states according to the prior art.
Figure 1B:
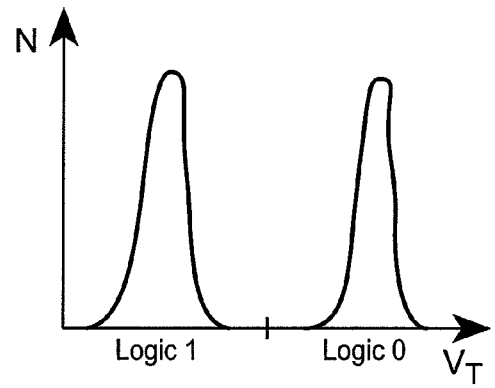
FIG. 1B shows threshold voltage distributions for cells programmed to two threshold voltage ranges representing the two logical states of FIG. 1A.
Figure 2A:
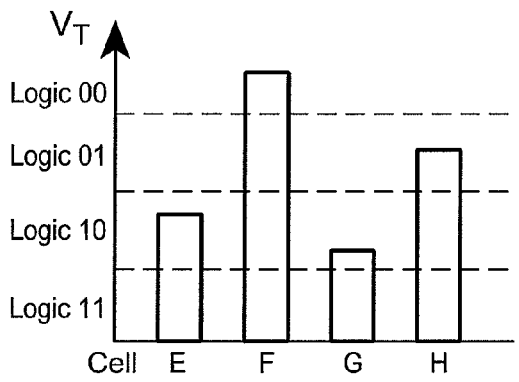
FIG. 2A shows threshold voltages of memory cells E-H, the threshold voltages representing four logical states according to the prior art.
Figure 2B:
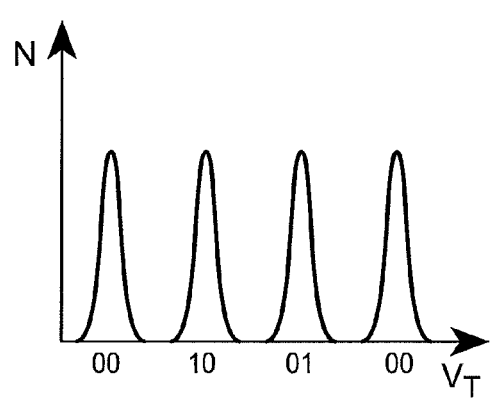
FIG. 2B shows threshold voltage distributions for cells programmed to four threshold voltage ranges representing the four logical states of FIG. 2A.
Figure 2C:
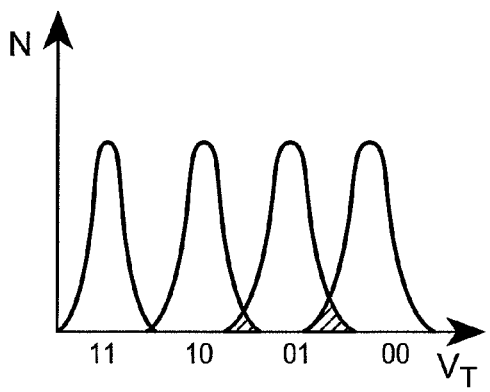
FIG. 2C shows another example of threshold voltage distributions for cells programmed to four voltage ranges representing the four logical states of FIG. 2A.
Figure 3:
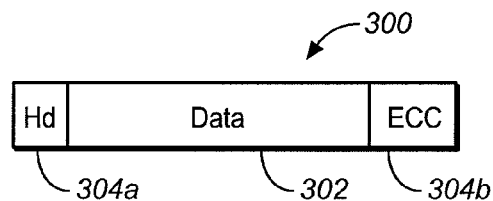
FIG. 3 shows a sector of data including ECC data according to the prior art.

According to an embodiment of the present invention, input data are encoded in a manner that allows a high level of error detection and correction. Thus, data may be stored using a number of logical states per cell that provides a significant number of misread bits of data when the data are read. In one example, convolutional coding is used to generate encoded data from unencoded data, where a bit of encoded data depends on more than one bit of unencoded data. Generally, in convolutional coding, each m-bit symbol (each m-bit string) is encoded into an n-bit symbol, where m/n is the code rate (n≧m) and the transformation is a function of the last k symbols received, where k is the constraint length of the code. Convolutional coding may be used with relatively low coding rates to allow a high level of error correction. This may allow a memory array to be used even where a lot of data is misread from the memory array.

While storing data with a low coding rate requires storing more bits of data, the ability to correct a large number of errors in the data may allow the data to be stored in a manner that would not otherwise be possible given particular hardware. For example, it may be possible to store data in a multilevel format even though this provides a higher bit error rate during read operations than would normally be manageable by conventional ECC. Encoding may greatly increase the number of bits to be stored, in one example (a ½ rate code), doubling the number of bits. According to an embodiment of the present invention, data may be encoded under certain conditions so that the number of bits to be stored increases and the amount of input data stored in a given portion of the memory array is reduced. This may be advantageous, for example where a portion of the memory array would otherwise be unusable, or to maintain multilevel operation where multilevel operation would not otherwise be possible, or to maintain multilevel operation at a level (number of states per cell) that would not otherwise be possible.

FIG. 4 shows an example of a convolutional encoder 410 according to an embodiment of the present invention. The convolutional encoder receives a series of data bits as an input 412 and generates a series of encoded data bits as an output 414. In the example of FIG. 4, the number of encoded data bits is double the number of data bits received by the encoder (n=2, m=1). Thus, the code rate is ½. An output symbol of two bits is generated for every bit of input data. However, the two bit symbol generated depends on more than one input bit (in this case, it depends on three input bits). Thus, in addition to generating two bits of output for every one bit of input, the two bits are not generated from only a single input bit, but are generated from a bit and two previously received bits (k=2). In other examples, different parameters may be used.

FIG. 5A illustrates how two-bit output symbols of output 414 are generated from input 412 in encoder 410 of FIG. 4. FIG. 5A shows a three bit shift register 520 into which input bits enter on the left and are shifted one place to the right on each clock cycle. In the scheme illustrated, one output bit (C0) is the sum of the present input bit b (S0 in shift register) and a previously received bit (S2 in shift register). The other output bit (C1) is the sum of the input bit b (S0 in shift register) and the previous two input bits (S1 and S2 in shift register). Encoder 410 of FIG. 5A may be implemented either as a dedicated circuit or through firmware in a controller or similar integrated circuit. The output bits C0 and C1 may be stored in the memory array as before. For example, bits C0 and C1 may be stored in a single cell that has four logical states. In this way, a single input bit b corresponds to two output bits C0, C1, which are stored in a single cell. However, unlike certain prior art systems, here the programming of the cell uses four logical states. Three bit shift register 510 may be initialized to some predetermined values for encoding the first bits of a new sequence. For example, a shift register may be initialized to all zeros.

FIG. 5B shows a table of outputs (C0 C1) generated by different input bits b given various previous inputs (current S1 S2). Also shown is the resulting state of the register (next S1 S2). While any series of input bits b may be received, the output is limited to certain allowed sequences of bits. For example, following a series of zeros as input bits (and hence a series of pairs of zeros as output bits), if an input is a zero, the output is a pair of zeros. If the input is a one, the output is a pair of ones. Thus, either one-zero (10) or zero-one (01) is not an allowed output. So, 00 00 00 and 00 00 11 are both allowed output sequences, but 00 00 10 and 00 00 01 are not allowed output sequences. Because many output sequences are not allowed, a different means of evaluating the errors during readback is provided than just evaluating whether a given (n,k) code word is within a given code space. Having such a capability can achieve greater performance in situations where the Hamming distance is beyond the capabilities of conventional ECC.

Figure 5C:
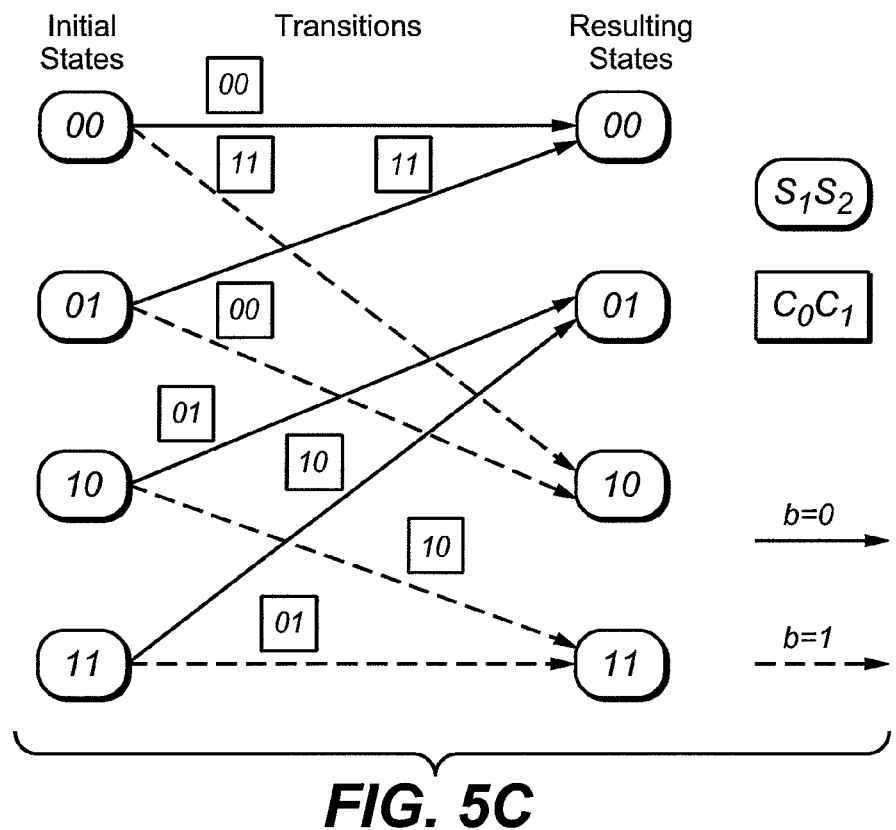
FIG. 5C is a trellis diagram showing transitions between states of the encoder of FIG. 5A that are produced by different inputs and showing the outputs produced by such transitions.

FIG. 5C shows a trellis diagram that gives an alternative illustration of the encoding scheme of FIG. 4. The trellis diagram represents the four possible initial states of the encoder on the left. Then, from each initial state, a solid line represents a transition caused by an input of 0 and a broken line represents a transition caused by an input of 1. The output for each transition is given in a box beside the corresponding line. The resulting states of the encoder after the transition occurs are given on the right. As can be seen, there are a limited number of possible outputs for any given state of the encoder. When data are read from the memory array and are decoded, an error in the data may be detected when a sequence of bits is read that is not an allowed sequence that could be generated by the encoder.

Figure 6:
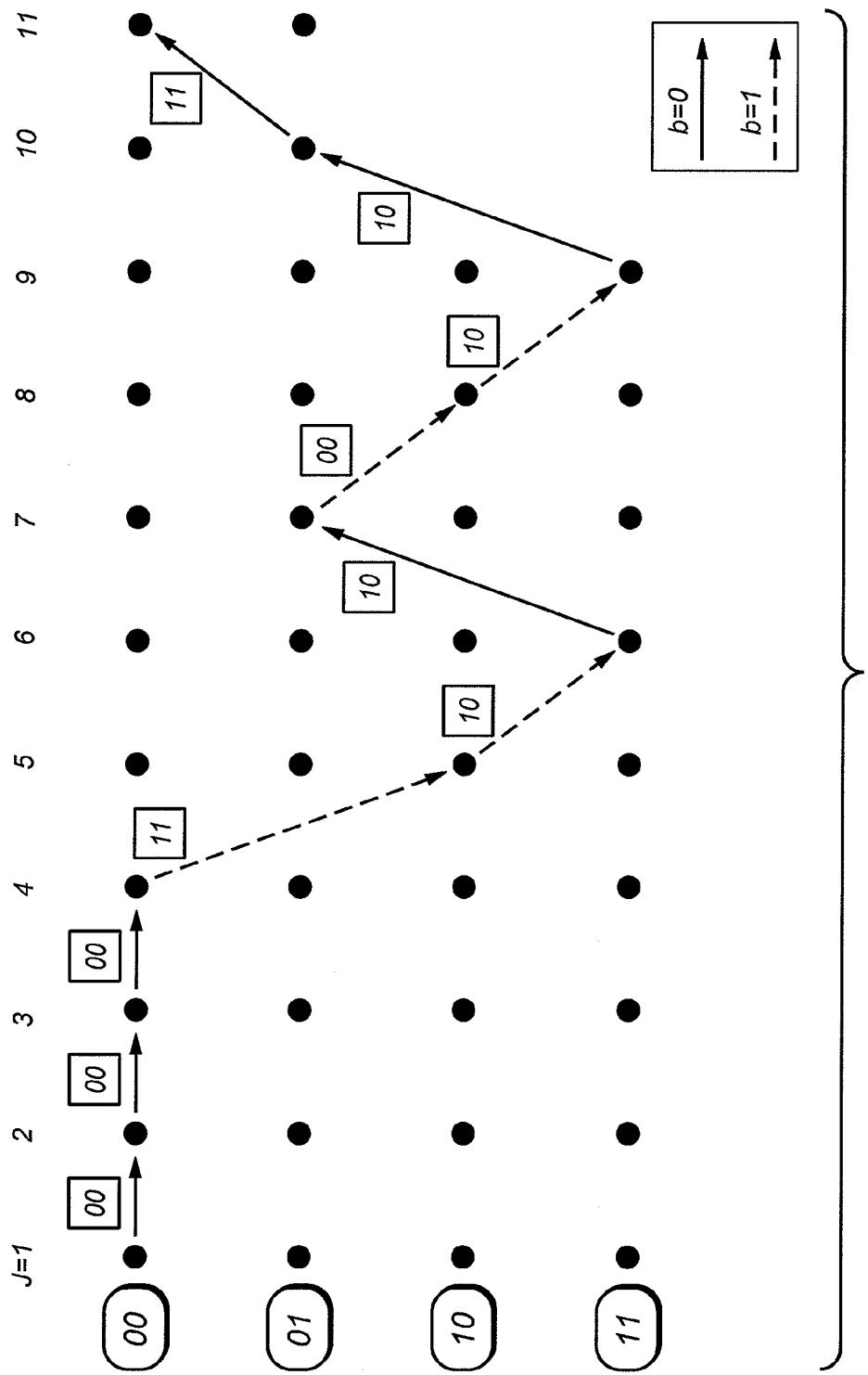
FIG. 6 is a trellis diagram showing a path produced by a particular series of input bits to the encoder of FIG. 5A.

FIG. 6 shows an extended trellis diagram including a series of transitions. Each transition represents a single bit of input data and two bits of output data. FIG. 6 shows input sequence 0011011000 (where the rightmost bit enters the encoder first. As can be seen from the outputs given in FIG. 5B or 5C, the output sequence generated by this input is 00 00 00 11 10 10 00 10 10 11 (from an initial state of 00). The input sequence generates a unique pathway through the trellis and thus creates a unique output. Only a limited number of pathways are allowed in this system.

When encoded data are read from the memory array, they are decoded to obtain the original input data. For example, where a host requests data that were previously stored in the memory array, the data are read from the memory array and are decoded and then sent to the host. Decoding may be performed by dedicated decoding circuits or by a controller with appropriate firmware. Encoding and decoding circuits may be combined and may both be considered as coding circuits. Errors may be present in the encoded data read from the memory array. However, decoding allows the original stored data to be recreated even where the encoded data contain a large number of errors. In one decoding scheme, sense amplifiers read threshold voltages of cells in the memory array and determine the logical states of the memory cells. These data are then sent to a decoder module that determines whether the encoded data correspond to an allowed path, and if they do not correspond to an allowed path, the decoder module identifies an allowed path that has the maximum likelihood of being the encoded data. The original data are then obtained from the identified path. Such a scheme may be considered a hard-input, hard-output system. A system that iterates on the maximum likelihood calculation is considered a soft-output system.

Figure 7:
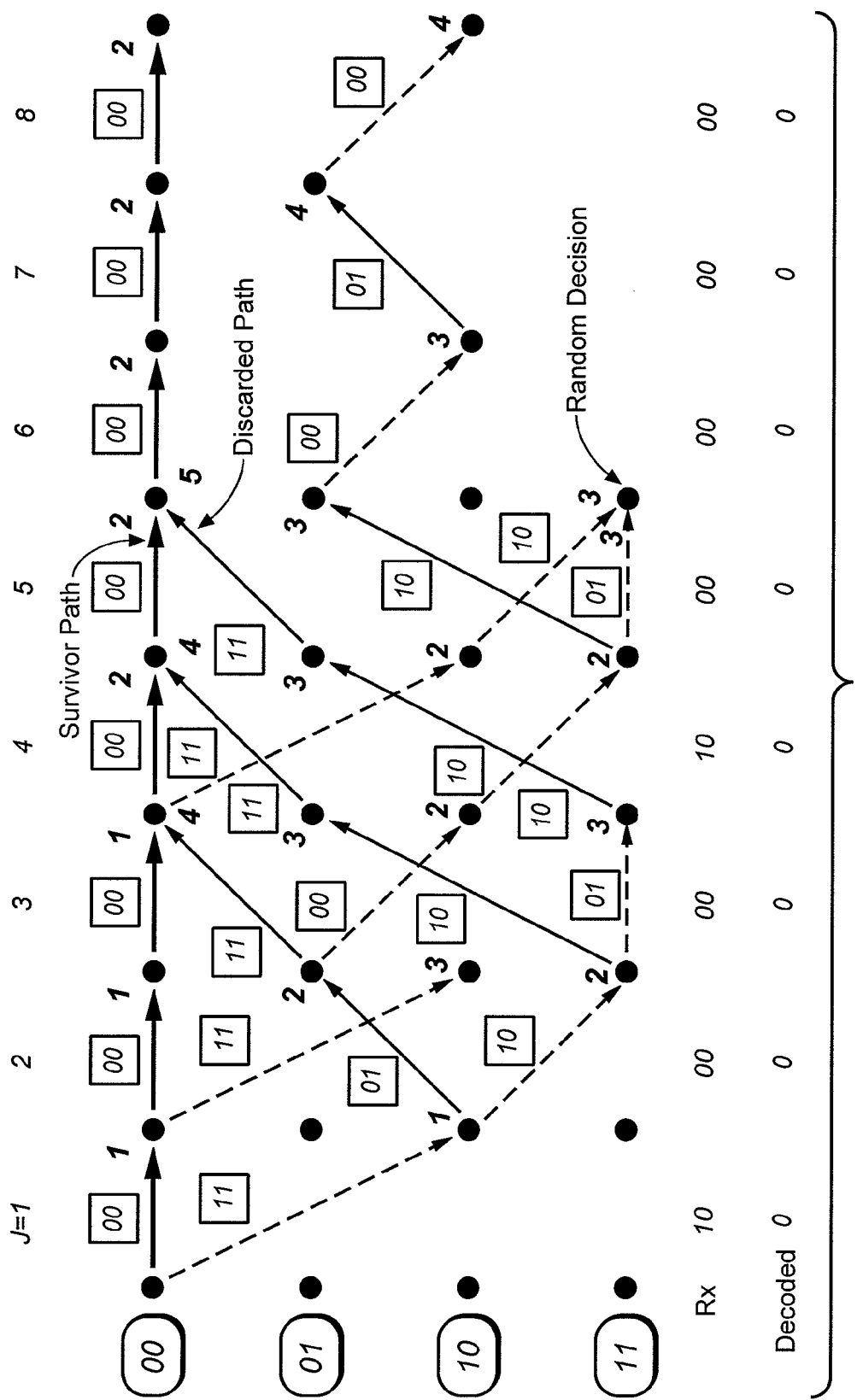
FIG. 7 is a trellis diagram showing decoding of a series of bits including erroneous bits.

FIG. 7 shows an implementation of hard-input, hard-output decoding using a Viterbi algorithm. The purpose of decoding is to determine the original data sequence from an encoded sequence, which may contain errors, when it is read from a memory array. Here original data comprised of all zeros (0000000) is encoded as all zeros (00000000000000). These encoded data are then read from the memory array as 10000010000000. Thus, two bits out of 14 have been changed (Hamming distance =2). FIG. 7 shows eight encoding stages, indicated by J=1, 2 . . . 8. At each stage an original input value of 0 is indicated by an unbroken line and an input of 1 is indicated by a broken line. Outputs generated by these inputs are indicated by two bits shown in boxes. The algorithm used to decode the data uses the following rules:

1. A branch metric is the Hamming distance between the original encoded bits of a trellis branch at a stage and the received bits at the same stage.
2. A path metric is the aggregated branch metrics of a path (shown by bold number at each stage of path.
3. When paths merge, the one with the larger path metric is discarded and the other, called the survivor path, is kept.
4. If two metrics are equal, a random decision is made to keep one path.
5. A final decision is made after a sufficiently large number of stages (8 in this example) to choose the path with the smallest path metric. Looking at FIG. 7, it can be seen that the data received from the memory (starting from the left), initially cause two possible paths to be analyzed. Subsequently, additional paths open as possibilities. When paths merge (such as after J=5) the path with the larger path metric is discarded (path metrics are indicated at each stage along a path by a number in bold). In this case, a discarded path has a path metric of 5 and is discarded in favor of a survivor path, which has a path metric of 2 at this point. Also, where two paths meet that have the same path metric, a random decision may be made to discard one of the paths. After eight stages (J=8) a decision may be made to choose the path with the smallest path metric. In this case, the upper (bold) path is chosen, because it has a path metric of 2. The path metric of the chosen path is the Hamming distance between the data received by the encoder and the decoded data. This should be equal to the number of bit errors in the data received by the encoder.

While FIGS. 4-7 show a particular example with a coding rate of ½, an input word of one bit, an output word of two bits and with a constraint length of 2, other convolutional coding schemes may be used that have different parameters. For example, different coding rates may be used depending on the number of errors expected to occur in the data read from the memory array. An output word of two bits is convenient for programming in a memory array that programs two bits per cell. However, where cells hold different numbers of bits, different output word lengths may be used. Hard-input, hard-output Viterbi coding is one example of a scheme that may be used. However, the invention is not limited to this or any other particular scheme.

Figure 8:
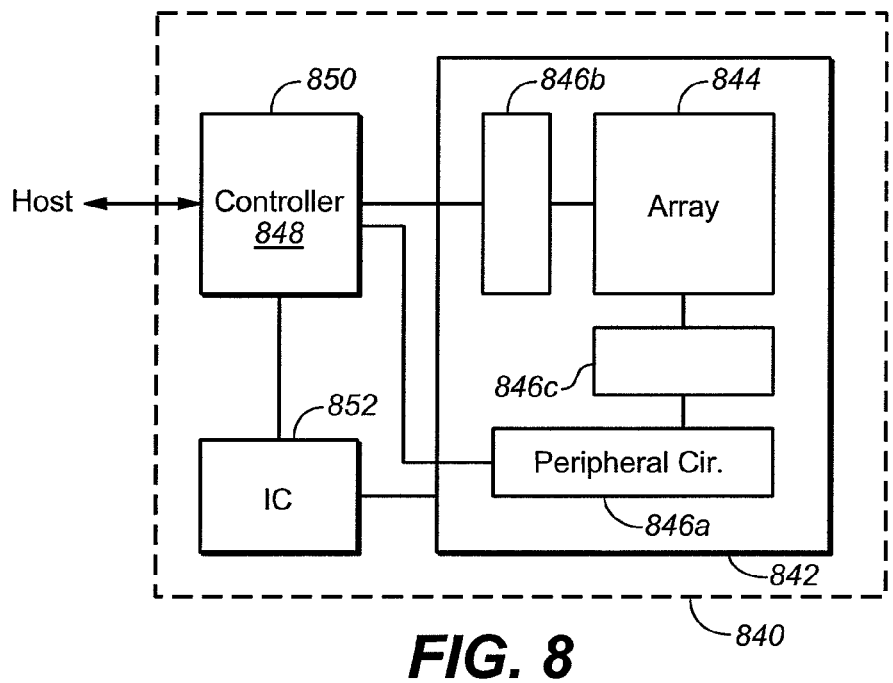
FIG. 8 shows a memory system including a memory chip that has peripheral circuits, a controller chip and an additional chip.

Embodiments of the present invention may include convolutional encoding and decoding circuits as part of a memory system. For example, dedicated encoding and decoding circuits may be formed as peripheral circuits on a memory chip. Alternatively, dedicated encoding and decoding circuits may be formed on other chips in a memory system. In one example, convolutional encoding and decoding is carried out by firmware in a controller of a memory system, such as an embedded or a removable memory system in a memory card or similar memory system. FIG. 8 shows a typical memory system 840 that may be embodied as a removable memory system or may be embedded in a host system. A memory chip 842 includes a memory array 844 and various peripheral circuits 846*a-c* including reading, writing and erasing circuits. Coding circuits may be formed as peripheral circuits on chip 842 and they may perform their functions in a manner that is transparent to memory controller 848. Alternatively, memory controller 848 may be involved in determining whether encoding should be performed. In another embodiment, encoding and decoding are performed by a controller (such as memory controller 848) and no dedicated coding circuits are used. Memory controller 848 is generally on a separate chip 850 to memory array 844. The addition of coding functionality to a controller may be achieved through firmware or may involve some changes to the hardware of a controller. In yet another embodiment, coding circuits may be provided on yet another chip (not the memory chip or the controller chip) such as integrated circuit 852. Where a memory system is in a removable format, a standard interface is generally provided so that the removable memory can be connected to host systems that also have a standard interface. The interface may include conductive pads that correspond to pins on a host interface. In addition, interface circuits may be provided. Alternatively, in an embedded architecture, a permanent connection may exist between the memory system and a host system.

In contrast to previous systems that used both binary and MLC data storage in a memory array, embodiments of the present invention may use MLC data storage throughout the memory array so that peripheral circuits that program data to the memory array and read data from the memory array may use the same programming scheme for all memory cells. Thus, no reconfiguration of programming or reading schemes is necessary to allow convolutionally encoded data to be stored. However, by using convolutional coding, areas of a memory array may continue to store data even though the number of errors in data read from these areas is high. In other embodiments, aspects of the present invention are combined with both binary and MLC storage (as described in U.S. Pat. Nos. 5,930,167 and 6,456,528 so that a single memory array may include binary data, MLC data and convolutionally encoded data.

In one example, a memory array (or a portion thereof) may be operated in two different modes. In a first (conventional) mode, one or more bits of input data are directly stored in each cell. Input data may be any data received as input by a memory system or received by a portion of a memory system that stores data in a memory array (this may include data generated by a controller for example). ECC bits may also be generated and stored with the programmed input data. For example, two bits of input data are stored as two bits in a single cell that has four possible logical states. In a second (convolutional coding) mode, a number of bits of input data are encoded as a greater number of bits of encoded data that are then stored in the memory array. For example, a bit of input data may be encoded as two bits of encoded data that are then stored in a single memory cell that has four possible logical states. The first mode may be used as a default mode because it stores data more efficiently in the memory array. The second mode may be used where a block (or other portion of the memory array) shows a large number of ECC errors, or where a wear count indicates that the block has exceeded its life expectancy or if, for any other reason, data may not reliably be stored in the first mode. In other examples, a memory may store a different number of bits per cell and different modes may be selected according to the level of errors expected. Thus, a lower coding rate may be chosen where more errors are expected.

While the embodiments described above provide alternative error correction techniques to those of the prior art, various embodiments described above may be combined with prior art techniques to provide error correction. For example, prior art ECC systems that use block based error correction may be combined with convolutional coding techniques according to an embodiment of the present invention. Thus, for example, input data may be received by a memory system and ECC data generated from the input data is appended to the input data. The input data and ECC data are then subject to convolutional coding, and the encoded data are stored in a memory array. When the data are to be read, the data are first decoded to recover the original data. Then recovered ECC data and recovered input data are subject to ECC-based error detection and correction. Thus, a concatenated error detection and correction scheme may be implemented, which significantly increases overall data recovery performance.

In addition to encoding host data for storage in a memory array, embodiments of the present invention may be used to encode other types of input data also. For example, data generated by a memory controller may be stored in a memory array. Such input data may be encoded prior to storage and decoded when read as with input data.

Although various aspects of the present invention have been described with respect to particular embodiments, it will be understood that the invention is not limited to these embodiments and that the invention is entitled to full protection within the scope of the appended claims.

The invention claimed is:

1. A method of storing a portion of digital data in a solid-state nonvolatile memory array, comprising:
    transforming a first data sequence consisting of a number of m-bit symbols into a second data sequence consisting of an equal number of n-bit symbols, where n is greater than m;
    wherein each symbol of the second sequence is determined by at least a first m-bit symbol of the first data sequence and a second m-bit symbol of the first data sequence; and
    storing the second data sequence in the nonvolatile memory array.

2. The method of claim 1 wherein m equals 1 and n equals 2.

3. The method of claim 2 wherein each symbol of the second sequence is determined by the first m-bit symbol and the second m-bit symbol and a third m-bit symbol.

4. The method of claim 2 wherein the nonvolatile memory array includes a portion that stores transformed data with one n-bit symbol per cell and also includes a portion that stores untransformed data with two m-bit symbols per cell.

5. The method of claim 1 wherein the portion of digital data includes input data and ECC data generated from the input data.

6. The method of claim 1 wherein the second data sequence is stored with one n-bit symbol in each memory cell of the memory array.

7. The method of claim 1 wherein the stored second sequence is subsequently read from the nonvolatile memory and transformed to recreate the first data sequence.

8. A method of storing a portion of digital data in a solid-state nonvolatile memory array in a memory system, comprising:
    receiving the portion of digital data in the memory system, the portion of digital data comprising a plurality of m-bit symbols;
    subsequently transforming the plurality of m-bit symbols into an equal number of n-bit symbols, where n is greater than m; and
    wherein the transformation of an individual one of the plurality of m-bit symbols is a function of the individual one of the plurality of m-bit symbols and a function of two or more previously received ones of the plurality of m-bit symbols; and subsequently storing the equal number of n-bit symbols in the nonvolatile memory array.

9. The method of claim 8 further comprising, subsequently, in response to a request from a host for the portion of data, the memory system transforming the n-bit symbols into m-bit symbols and sending the m-bit symbols to the host.

10. The method of claim 8 wherein misread ones of the n-bit symbols are corrected prior to being converted into m-bit symbols.

11. The method of claim 8 wherein the solid-state nonvolatile memory array stores both transformed data and untransformed data.

12. The method of claim 8 wherein m=1 and n=2.

13. The method of claim 8 wherein the transformation has a limited number of possible outputs that is less than all possible sequences of n-bit symbols.

14. The method of claim 13 further comprising reading the equal number of n-bit symbols from the nonvolatile memory array and detecting an error where the read n-bit symbols include a sequence of symbols that is not a possible output of the transformation.

15. The method of claim 13 further comprising correcting the read n-bit symbols by selecting a possible sequence that is most likely to produce the read n-bit symbols.

16. A nonvolatile memory system, comprising:
a solid-state memory array;
convolutional encoding circuits that receive a number of m-bit symbols as input and generate an equal number of n-bit symbols as output, n being greater than m, an individual n-bit symbol determined from two or more m-bit symbols; and
memory write circuits that write the equal number of n-bit symbols to the memory array.

17. The nonvolatile memory system of claim 16 wherein the convolutional coding circuits are formed on the same integrated circuit chip as the solid-state memory array.

18. The nonvolatile memory system of claim 16 wherein the convolutional coding circuits are part of a controller having convolutional coding firmware, the controller formed on a separate integrated circuit chip to the solid-state memory array.

19. The nonvolatile memory system of claim 16 further comprising read circuits that read n-bit symbols from the memory array and further comprising decoding circuits that decode the n-bit symbols to generate m-bit symbols.

20. The nonvolatile memory of claim 16 further comprising error detection and correction circuits that detect and correct errors in the n-bit symbols read from the memory array.

21. The nonvolatile memory system of claim 16 further comprising block Error Correction Code (ECC) circuits.

22. The nonvolatile memory system of claim 16 wherein the nonvolatile memory system is formed as a removable memory system having an interface that connects to a host system.

23. The nonvolatile memory of claim 16 where m=1 and n=2.

24. The nonvolatile memory of claim 16 wherein an individual n-bit symbol is determined by three sequential m-bit symbols.

25. A nonvolatile memory system comprising:
a nonvolatile memory array;
convolutional encoding circuits that transform a first sequence consisting of m-bit symbols into a second sequence consisting of an equal number of n-bit symbols, where n is greater than m, an individual n-bit symbol determined from at least two m-bit symbols;
write circuits that write the second sequence to the nonvolatile memory array;
read circuits that read the second sequence from the nonvolatile memory array; and
error correction circuits that correct errors in the read second sequence.

26. The nonvolatile memory system of claim 25 wherein convolutional encoding circuits have a number of possible output sequences of n-bit symbols that is less than the number of all possible sequences of n-bit symbols.

27. The nonvolatile memory system of claim 25 wherein the error correction circuits correct errors in the read second sequence by identifying the most likely possible sequence.

28. The nonvolatile memory system of claim 25 further comprising block ECC circuits that derive ECC data from input data and append the ECC data to the input data.

* * * * *